(12) United States Patent
Gan et al.

(10) Patent No.: US 8,617,987 B2
(45) Date of Patent: Dec. 31, 2013

(54) THROUGH HOLE VIA FILLING USING ELECTROLESS PLATING

(75) Inventors: Kah Wee Gan, Muar (MY); Yonggang Jin, Singapore (SG); Yun Liu, Singapore (SG); Yaohuang Huang, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 282 days.

(21) Appl. No.: 12/982,697

(22) Filed: Dec. 30, 2010

(65) Prior Publication Data

US 2012/0168942 A1 Jul. 5, 2012

(51) Int. Cl.
*H01L 21/44* (2006.01)
*H01L 21/48* (2006.01)

(52) U.S. Cl.
USPC .......................................... 438/667; 438/109

(58) Field of Classification Search
USPC ..................... 438/106, 107, 109, 653, 667; 257/E21.584, E21.499, E23.069, 257/E25.012, E25.013

See application file for complete search history.

(56) References Cited

U.S. PATENT DOCUMENTS

| 6,506,668 | B1 * | 1/2003 | Woo et al. ...................... 438/584 |
| 8,088,648 | B2 * | 1/2012 | Jo et al. ......................... 438/109 |
| 2008/0044944 | A1 * | 2/2008 | Wakisaka et al. ............. 438/106 |

* cited by examiner

*Primary Examiner* — Hung Vu
(74) *Attorney, Agent, or Firm* — Seed IP Law Group PLLC

(57) ABSTRACT

An embedded wafer level ball grid array (eWLB) is formed by embedding a semiconductor die in a molding compound. A trench is formed in the molding compound with a laser drill. A first layer of copper is deposited on the sidewall of the trench by physical vapor deposition. A second layer of copper is then formed on the first layer of copper by an electroless process. A third layer of copper is then formed on the second layer by electroplating.

9 Claims, 12 Drawing Sheets

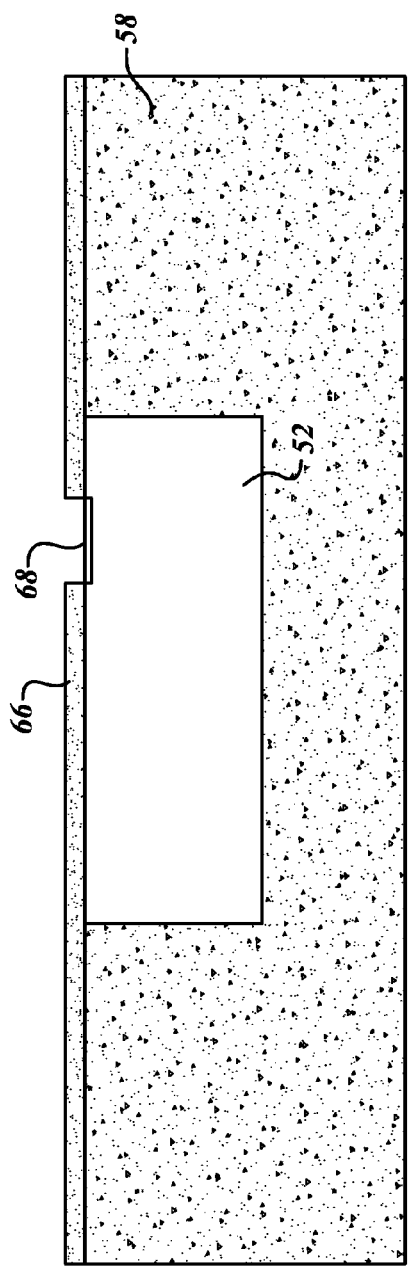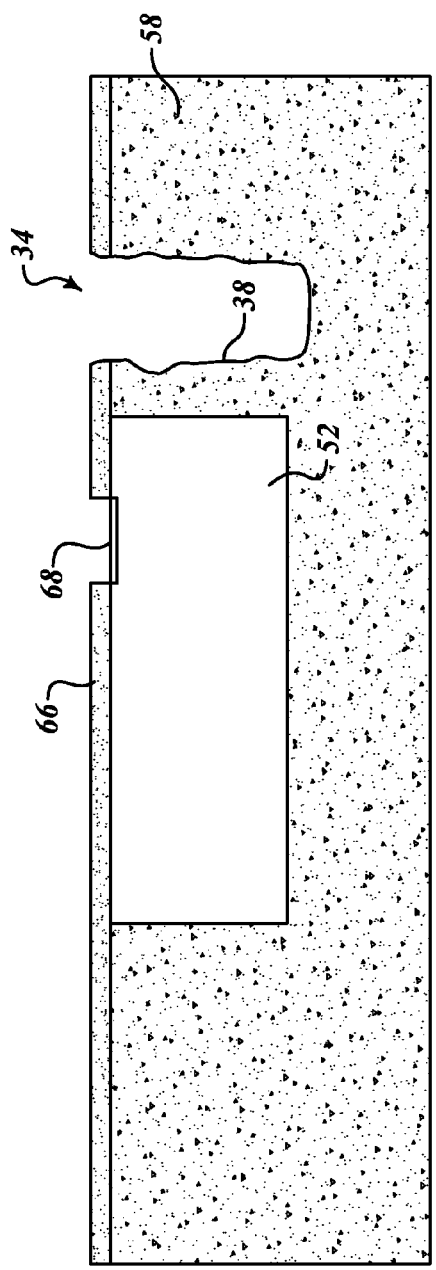

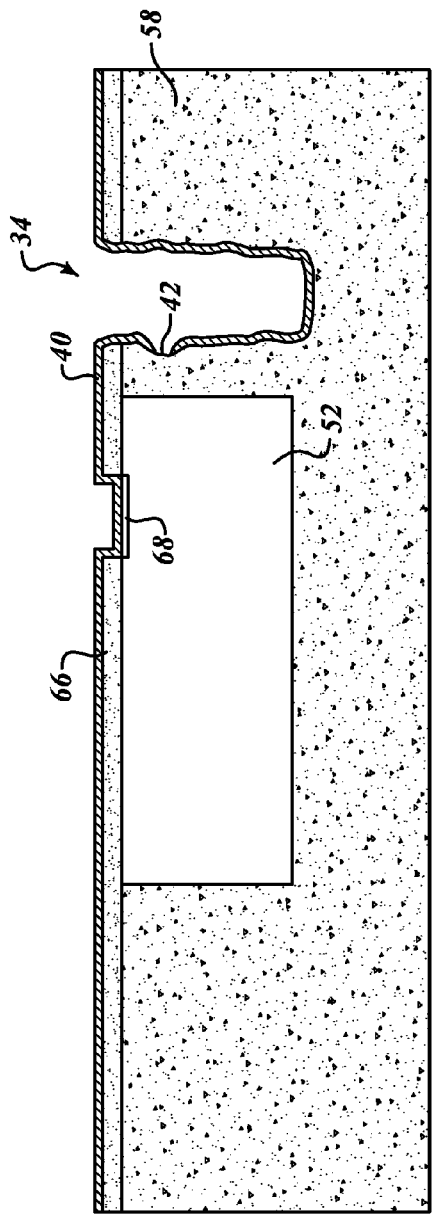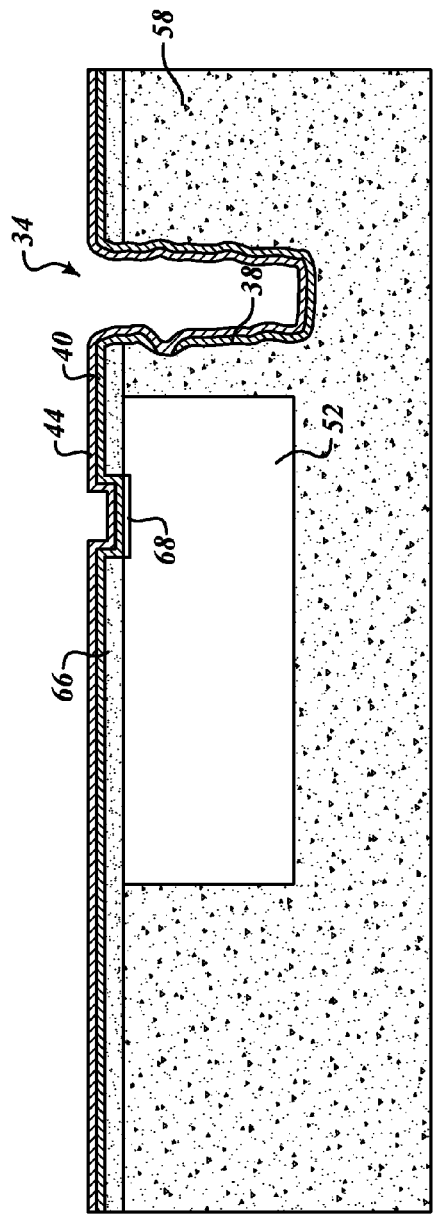

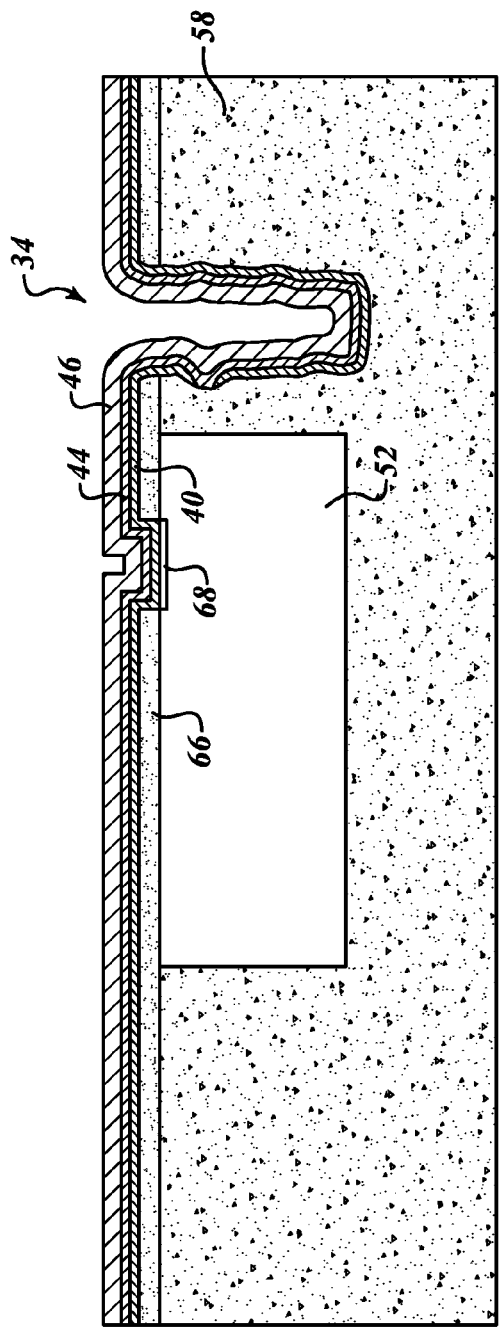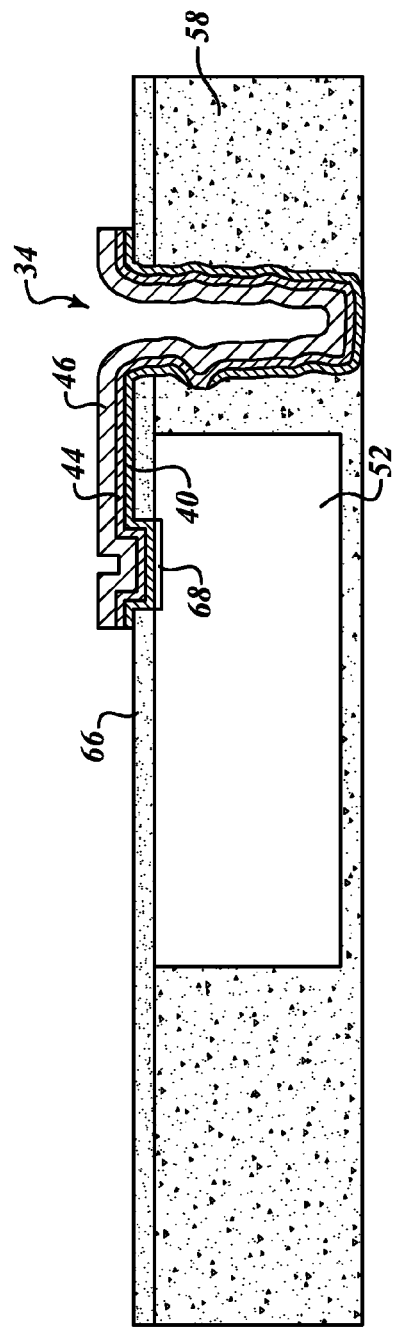

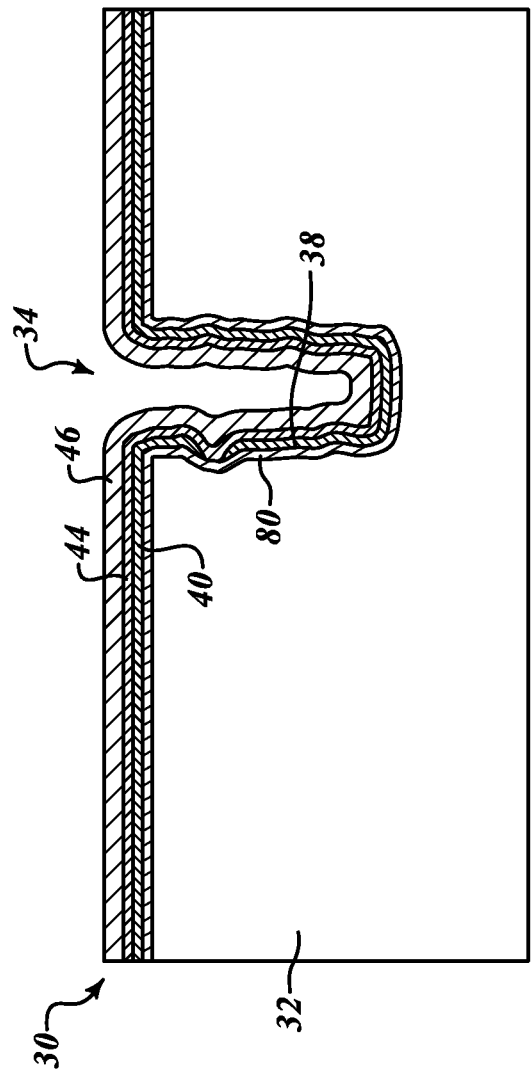

US 8,617,987 B2

THROUGH HOLE VIA FILLING USING ELECTROLESS PLATING

BACKGROUND

1. Technical Field

The present disclosure relates to the field of integrated circuits. The present disclosure relates more particularly to integrated circuit packaging.

2. Description of the Related Art

Integrated circuits are used in a large variety of applications. Individual integrated circuits can take the form of voltage amplifiers, voltage regulators, digital signal processors, microcontrollers, wireless adapters, microprocessors, smart cards, and many other devices. Some integrated circuits have circuitry that performs many of these functions on a single chip.

Integrated circuits are installed in desk top computers, lap top computers, cell phones, MP3 players, automobiles, printers, scanners, wireless routers, and in nearly every other kind of electronic device. Integrated circuits are generally packaged in such a way that they can easily be installed in one of the above mentioned devices. Methods of packaging integrated circuits include the use of ball grid arrays (BGAs), pin grid arrays (PGAs), lead frames, and many other methods. The balls, pins, and leads of the various integrated circuit packages provide the electrical connections between the integrated circuit and the electronic device in which it is installed. Most kinds of integrated circuit packages include a molding compound that encapsulates the integrated circuit and protects it from damage and provides electrical insulation.

In many devices, individual packaged integrated circuits are stacked one on top of the other. This saves surface area in the electronic device but also leads to complications in electrically connecting the integrated circuits to each other and to the electronic device. In such devices the integrated circuit packages generally have electrical connections on a top surface and a bottom surface of the package. One method for connecting top and bottom surfaces of a package is to form vias through the semiconductor die to allow electrical connection of the top of the package to the bottom of the package. However this uses valuable surface area of the semiconductor die to make the vias.

BRIEF SUMMARY

One embodiment is an integrated circuit package in which an integrated circuit is embedded in a molding compound. The molding compound extends laterally from the integrated circuit to such an extent that a via, trench, or aperture can be drilled through the molding compound. The via is spaced laterally from the integrated circuit. Copper is deposited on the sidewalls of the via and connects to contact pads of the integrated circuit.

Molding compounds are often formed with relatively large silica filler particles mixed into an epoxy. When a via is formed in a molding compound, it is possible that silica particles will protrude from the molding compound into the via, making it difficult to cover all of the sidewall of the via with copper.

In one embodiment the copper is formed on the sidewalls of the via in three layers. A first layer of copper is deposited on the sidewall of the via by physical vapor deposition. A second layer of copper is deposited on the first layer of copper by electroless plating. A third layer of copper is deposited on the second layer of copper by electroplating. The three layers of copper are electrically connected to a die pad on the top or bottom of the integrated circuit. Solder balls may be connected to the top and/or bottom of the integrated circuit package. The integrated circuit can then be placed in an electronic device, for example on a printed circuit board in the electronic device. Additional integrated circuit packages or individual passive circuit components can be stacked on the integrated circuit package. In one embodiment a diffusion barrier layer of TiN or other common diffusion barrier materials may be formed between the first copper layer and the sidewall of the via.

In one embodiment three layers of copper are deposited in a via or trench in a substrate other than a molding compound. In one embodiment three layers of a conductor other than copper are deposited in a via or trench.

BRIEF DESCRIPTION OF THE SEVERAL VIEWS OF THE DRAWINGS

FIGS. 2G-2N illustrate various process steps for forming a conducting via through a molding compound according to one embodiment.

FIG. 5 is a cross section of an aperture formed in a substrate and covered in conducting material according to one embodiment.

DETAILED DESCRIPTION

Figure 1A:
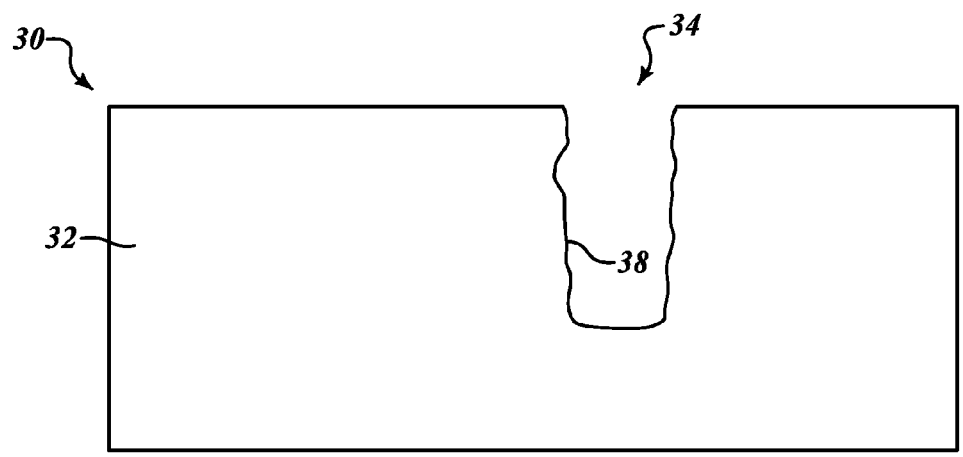
FIGS. 1A-1D illustrate a process for depositing a conducting material in a trench in a substrate according to one embodiment.

FIG. 1A illustrates a cross section of a substrate 32 in which a trench 34 has been formed. The trench 34 may be an aperture in the substrate 32 or a via in the substrate 32. The substrate 32 is for example a dielectric material having a granular composition. The granular composition could be a molding compound having silica particles. Due to the granular composition of the substrate 32, a sidewall 38 of the trench has an uneven surface.

Figure 1B:
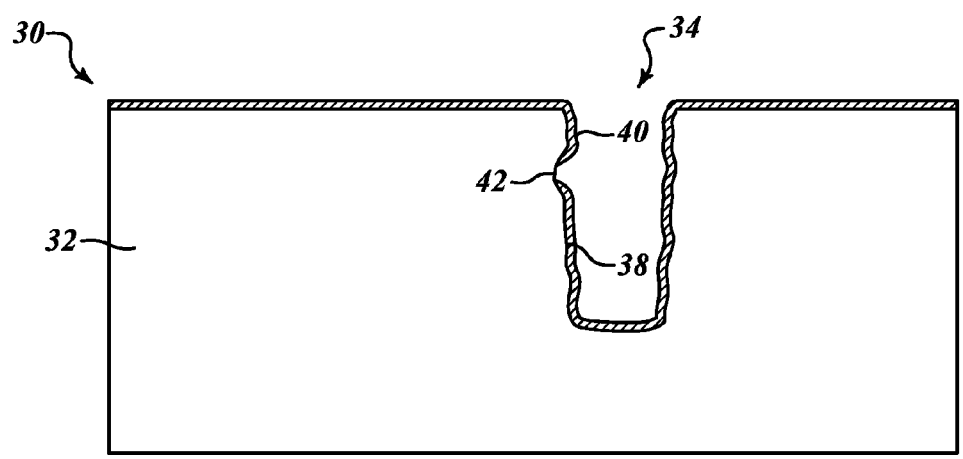

In FIG. 1B a first copper layer 40 has been deposited on the sidewall 38 of the trench 34. The first copper layer 40 is a seed layer of copper. Due to the unevenness of the sidewall 38 of the trench 34, a recessed portion 42 of the sidewall 38 of the trench 34 is not covered by the first copper layer 40. The first copper layer 40 is deposited for example by physical vapor deposition and is for example 200 nm thick.

In one embodiment the physical vapor deposition process is a sputtering process. Sputtering is a process in which a thin film is deposited on a surface by bombarding a separate target material with high energy particles. Atoms from the target material are ejected from the target material and deposited on the exposed surface on which the thin film will be formed. The thickness of the deposited thin film can be controlled by the sputtering time, the temperature in the sputtering chamber, the pressure in the sputtering chamber, and the energy of the bombarding particles. When copper is the target material, ejected copper atoms settle on an exposed surface and form a layer of copper on the surface. In the case of the uneven sidewall 38 of trench 34 of FIG. 1B, it is possible that copper atoms of the first copper layer 40 will not entirely cover the recessed portion 42 of sidewall 38.

Figure 1C:
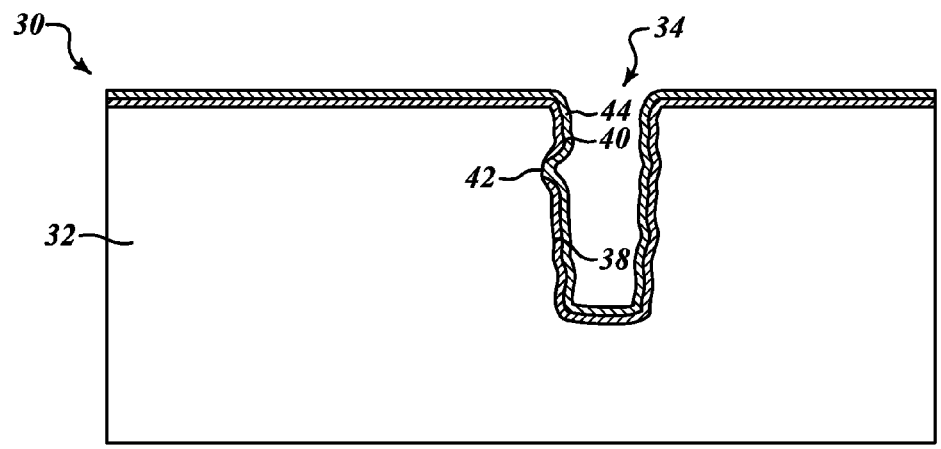

In FIG. 1C a second copper layer 44 has been deposited on the first copper layer 40. The second layer of copper 44 is formed for example by electroless plating. In electroless copper plating, a surface to be coated is submersed in a solution including several chemicals and copper salt. When a surface to be coated is submersed in the solution, chemical reactions in the solution cause a thin layer of copper to be deposited on the surface. Second copper layer 44 deposited by an electroless process covers first copper layer 40 and the recessed portion 42. The second copper layer 44 is for example 200 nm thick.

However, the electroless process is a very slow process and electroless layers generally cannot be formed quickly. Therefore in FIG. 1D a third copper layer 46 is deposited on the second layer 44 by an electroplating process. In one example of a copper electroplating process, a voltage is applied between two electrodes submersed in an electrolyte solution. One electrode, the anode, is a source of copper atoms and the other electrode, the cathode, is the surface to be plated with copper. The anode is connected to a positive voltage and the cathode is connected to a negative voltage. Copper atoms on the anode are oxidized and dissolved by the electrolyte solution leaving free copper ions in the solution. The free copper ions are then drawn to the negatively biased cathode where they coat the cathode in a layer of copper. Third copper layer 46 is formed in this manner. The process for electroplating described above is given by way of example only; other suitable processes for electroplating may be used.

Figure 1D:
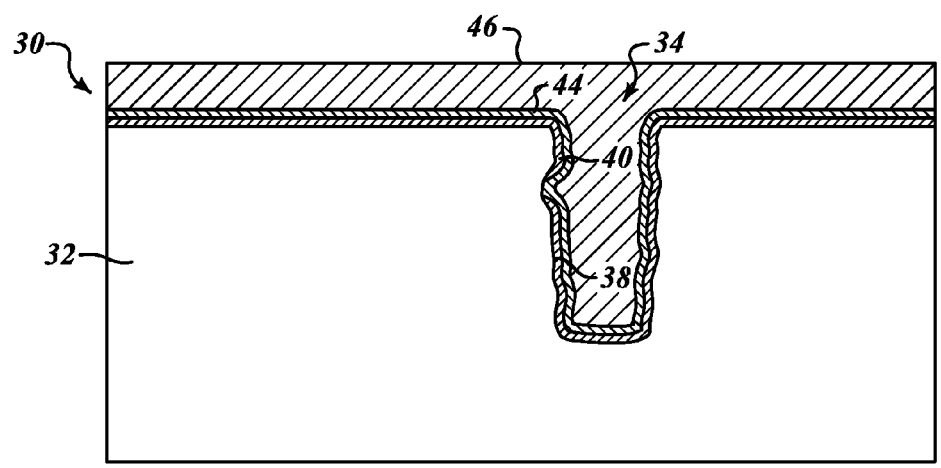

The sidewall 38 of trench 34 in FIG. 1D is coated in three layers 40, 44, 46 of copper. The third copper layer 46 is shown in FIG. 1D as completely filling the trench 34. However, in other embodiments the third copper layer 46 may coat the second copper layer 44 to a thickness that does not completely fill the trench 34. In one embodiment, trench 34 is a via contacting a further conducting layer below. In such an embodiment the copper layers 40, 44, 46 are electrically connected to the further conducting layer below.

In one embodiment, the substrate 32 is a dielectric material having a granular composition as has been described. Because the dielectric material has protrusions and indentations, the physical vapor deposition process may be very thin in some locations, such as recess portion 42 may have apertures therein such that it is missing altogether along some of the sidewalls of the trench 34. Placing the substrate 32 into a solution having copper based chemicals therein invites the advantage that additional copper atoms will attach to the first copper layer 40 which has been deposited by PBD deposition and fill in many of the thin places as well as bridge across any apertures and fill in any recesses in the trench 34 so that a single continuous copper layer is provided inside the trench 34. The prior deposition of the copper layer 40 by PBD deposition provides the advantage that a copper substrate is present as a seed layer to which the chemical atoms from the solution may quickly and easily attach to extend the copper layer 40 to new areas and also thicken the copper layer, thus making the new layer 44 as an additional layer built upon layer 40 and filling in many of the locations where the layer 40 contained thin areas or small gaps.

Figure 2A:
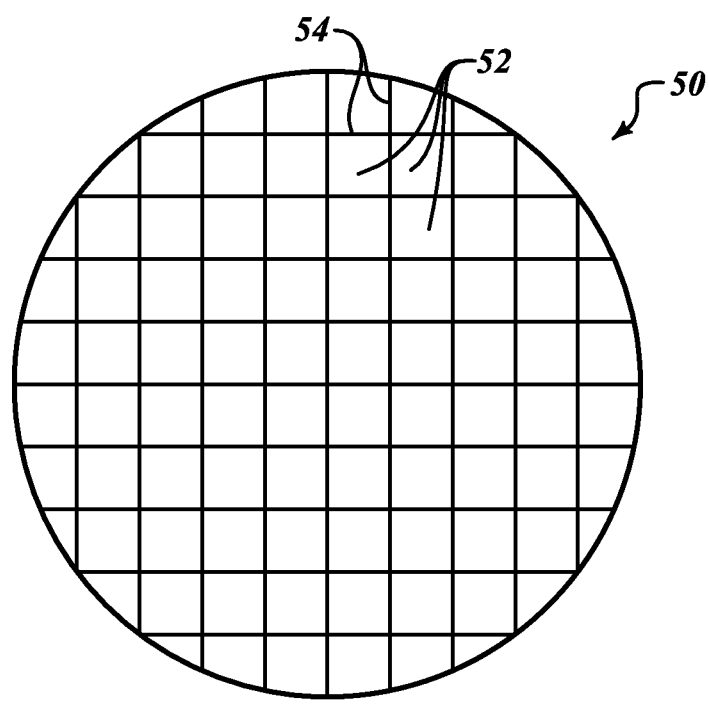
FIG. 2A is a top view of a semiconductor wafer according to one embodiment.

FIG. 2A is a top view of a semiconductor wafer 50. The semiconductor wafer 50 is for example a monocrystalline silicon wafer 50, but may be of another semiconductor material. The semiconductor wafer 50 has been processed by conventional means to form a plurality of integrated circuits 52. Scribe lines 54 separate the integrated circuits 52 from each other. When processing of the semiconductor wafer 50 is complete, a saw dices the semiconductor wafer 50 along the scribe lines 54 to obtain a plurality of physically separate integrated circuits 52.

Figure 2B:
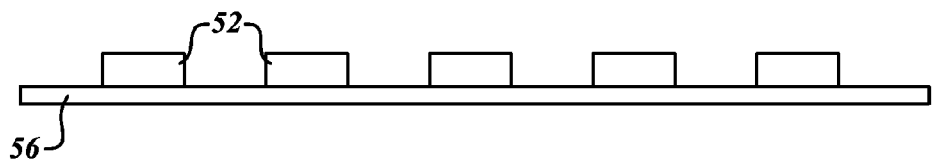
FIG. 2B is a side view of a plurality of semiconductor dies on an adhesive tape according to one embodiment.
Figure 2C:
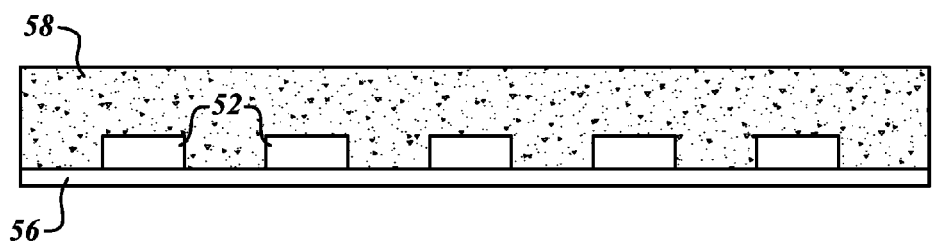
FIG. 2C is a side view of a plurality of semiconductor dies on an adhesive tape covered by a molding compound according to one embodiment.
Figure 2D:
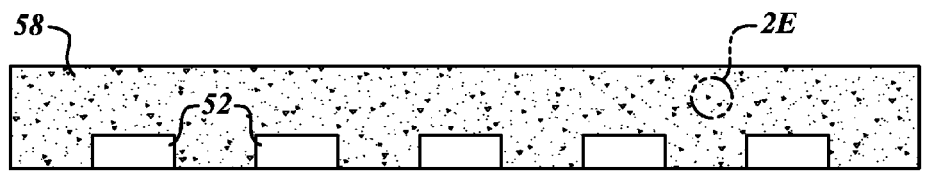
FIG. 2D is a side view of a plurality of semiconductor dies on an adhesive tape covered by a molding compound according to one embodiment.

In FIG. 2B the integrated circuits 52 have been placed on an adhesive layer 56. The adhesive layer 56 is for example an adhesive tape that holds the integrated circuits 52 in place during a further processing step. In FIG. 2C a molding compound is deposited on the adhesive layer 56 and hardened to form a reconstituted wafer 58. The reconstituted wafer 58 is generally rigid. The integrated circuits 52 are embedded in the reconstituted wafer 58. In FIG. 2D the adhesive tape 56 is removed from the reconstituted wafer 58 and integrated circuits 52.

Figure 2E:
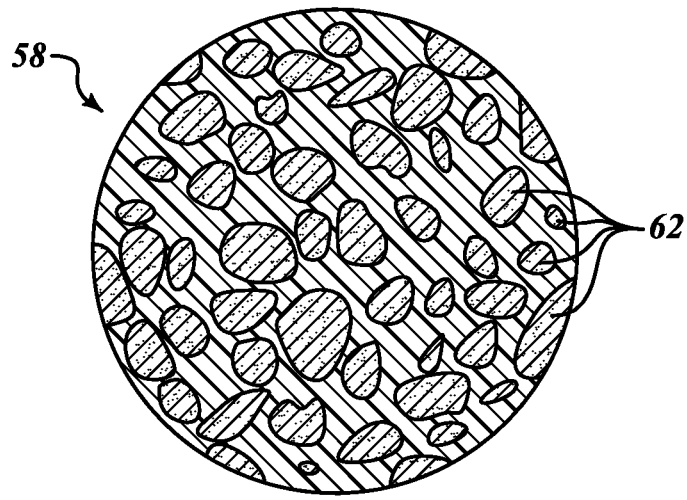
FIG. 2E is a magnified view of a portion of a molding compound according to one embodiment.

FIG. 2E is an enlarged view of a portion of reconstituted wafer 58 formed from a molding compound. The molding compound is generally formed from silica particles 62 in an epoxy resin. Other compounds and materials may also be present in the molding compound. The silica particles 62 can be many different sizes as shown in FIG. 2E. Generally the silica particles 62 are between 25 µm and 75 µm in diameter. As will be discussed in more detail below, the presence of the silica particles 62 can cause complications in the processing of the reconstituted wafer 58.

Figure 2F:
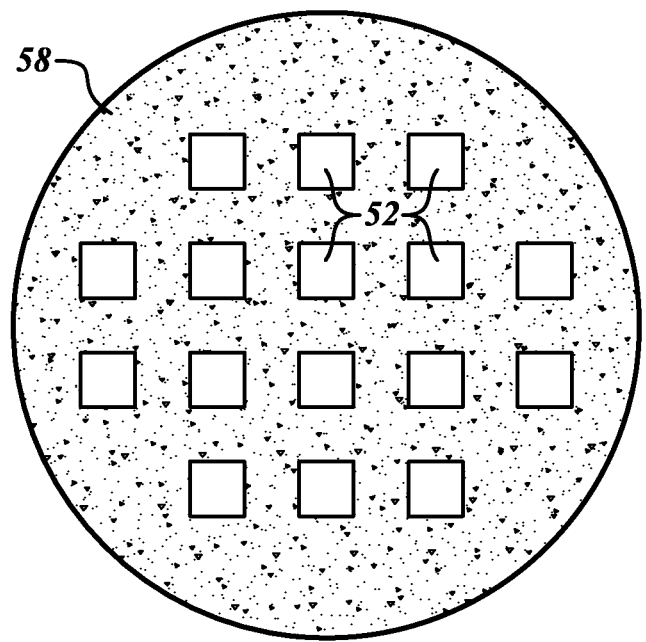
FIG. 2F is a top view of a plurality of semiconductor dies on a reconstituted wafer formed of a molding compound according to one embodiment.

FIG. 2F is a top view of the reconstituted wafer 58. The reconstituted wafer 58 is a circular wafer having integrated circuits 52 embedded therein. The reconstituted wafer 58 is generally larger than the semiconductor wafer 50 of FIG. 2A. Here a smaller number of integrated circuits 52 are shown in the reconstituted wafer 58 than were on the semiconductor wafer 50. However, in practice the reconstituted wafer may be large enough to accommodate all integrated circuits 52 from the semiconductor wafer 50.

The integrated circuits 52 are spaced apart laterally from each other in the reconstituted wafer 58. This allows the reconstituted wafer 58 to be used for metal redistribution lines. Vias can be drilled in the reconstituted wafer 58 adjacent the integrated circuits 52. The vias can be lined with copper or other conductors and can electrically connect the integrated circuits 52 to solder balls or other connection structures on opposite surfaces of the reconstituted wafer 58. Because the reconstituted wafer 58 is made from an inexpensive molding compound, the reconstituted wafer 58 can be easily and inexpensively formed. The reconstituted wafer can be utilized for integrated circuit packaging having electrical connections to the integrated circuit 52 on a top surface and a bottom surface of the reconstituted wafer. Because vias are formed in the reconstituted wafer 58 instead of the in the integrated circuit 52, no extra surface area of the integrated circuit 52 is wasted in making through vias between a top surface and a bottom surface of the integrated circuit 52.

FIG. 2G illustrates a portion of the reconstituted wafer 58 including an integrated circuit 52 embedded therein. The reconstituted wafer 58 has been flipped so that an exposed surface of the integrated circuit 52 is facing up. In FIG. 2G a dielectric layer 66 has been deposited over the reconstituted wafer 58 and the integrated circuit 52. The dielectric layer 66 has been etched to expose a die pad 68 of the integrated circuit 52. The dielectric layer 66 is a passivation layer that can be formed of any suitable dielectric material, including liquid and dry films.

In FIG. 2H a trench or aperture 34 has been formed in the reconstituted wafer 58 adjacent the integrated circuit 52. The trench 34 is formed for example by a laser drill. However, the trench 34 may be formed by other suitable processes including chemical etching. As can be seen from FIG. 2H the sidewall 38 of the trench 34 is not smooth and contains numerous protrusions and indentations. This is due in part to the presence of the silica particles 62 in the reconstituted wafer 58. During drilling of the trench 34, some silica particles 62 may break away from the sidewall 38 of the trench 34 leaving indentations. The indentations can be problematic for coating the sidewall 38 of the trench 34 with a conducting material.

In FIG. 2I a first copper layer 40 is deposited on the dielectric layer 66, on the die pad 68, and on the sidewall 38 of the trench 34. The first copper layer 40 is for example a copper seed layer deposited by physical vapor deposition. The first copper layer 40 is about 200 nm thick in one embodiment. As can be seen in FIG. 2I, the first copper layer 40 does not completely cover an indented portion 42 of the sidewall 38 of the trench 34. The indented portion 42 is caused for example by a silica particle 62 that has become dislodged from the sidewall 38 of the trench 34 as described above.

In FIG. 2J a second copper layer 44 has been deposited on the first copper layer 40. The second copper layer 44 is deposited for example by electroless deposition as described above. The second copper layer 44 completely covers the first copper layer 40 and the indented portion 42 of the sidewall 38 of the trench 34. However, because an electroless process for depositing the copper layer 44 is comparatively time consuming, the second copper layer 44 is grown only to a thickness of about 200 nm.

In FIG. 2K a third copper layer 46 is deposited on the second copper layer 44. The third copper layer 46 is deposited for example by electroplating as described above. Electroplating processes generally deposit copper much more quickly than electroless deposition processes. The third copper layer 46 is deposited to a thickness of about 5 µm. The third copper layer 46 does not fill the entire trench 34 as shown in the embodiment of FIG. 2H, but in other embodiments the third copper layer 46 may fill the entire trench 34. The first, second, and third copper layers 40, 44, 46 are in electrical connection with the die pad 68.

In FIG. 2L the copper layers 40, 44, 46 are patterned and etched. The copper layers 40, 44, 46 can be patterned and etched using conventional photolithography and chemical etch processes for etching copper. The copper layers 40, 44, 46 remain on the sidewall 38 of the trench 34 and on the die pad 68 of the integrated circuit 52.

In FIG. 2L the reconstituted wafer 58 is subjected to a back-grinding process. The back-grinding process reduces the thickness of the backside of the reconstituted wafer 58 until the first copper layer 40 is exposed. Back-grinding processes are commonly used to reduce the thickness of semiconductor wafers prior to dicing. Back-grinding of the reconstituted wafer 58 can be performed according to suitable conventional method for back-grinding.

When the reconstituted wafer 58 is back-grinded, the exposed first copper layer 40 is exposed on the bottom of the trench 34. The exposed first copper layer 40 at the backside of the reconstituted wafer 58 allows for electrical connection with the die pad 68 of the integrated circuit 52 from the backside of the reconstituted wafer 58.

Figure 2M:
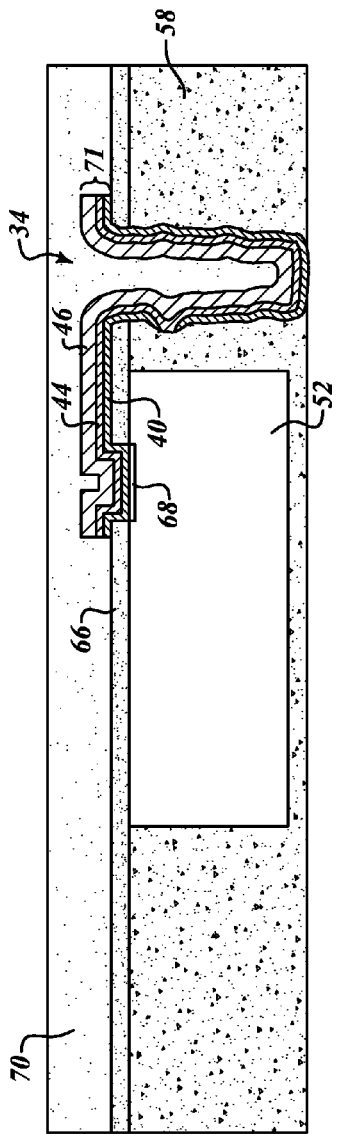

In FIG. 2M a passivation layer 70 is formed on the dielectric layer 66 and on the third copper layer 46. The passivation layer 70 is an electrical insulator that also serves to protect the integrated circuit 52 from exposure to moisture, contamination, or other hazards that could damage the integrated circuit 52. The final passivation layer 70 may be any suitable dielectric material. In one embodiment the final passivation layer 70 is a molding compound similar or identical to the molding compound that forms the reconstituted wafer 58.

In FIG. 2M the first, second, and third copper layers 40, 44, 46 collectively form copper layer 71. Thus copper layer 71 includes first, second, and third copper layers 40, 44, 46.

After the final passivation layer 70 has been formed, the reconstituted wafer 58 is diced into individual integrated circuit packages each containing an integrated circuit 52 embedded in a portion of the reconstituted wafer 58. While FIG. 2M illustrates a single trench 34 and a single die pad 68, in practice there may be multiple trenches 34 on all sides of the integrated circuit 52. The copper layers 40, 44, 46 may fill each trench 34 and connect each trench 34 to a separate die pad 68. The back-grinding of the reconstituted wafer 58 exposes the first copper layer 40 in each additional trench 34. The packaged integrated circuit 52 may be installed in an electrical device using solder balls attached to the exposed portions of the first copper layer 40 on either side of the reconstituted layer.

Figure 2N:
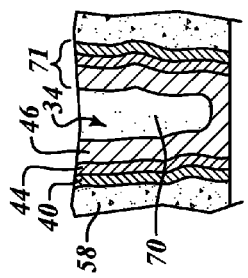

FIG. 2N illustrates a further alternative embodiment in which the trench 34 is constructed considerably deeper than the thickness of the integrated circuit 52. In this particular embodiment, when the back-grinding takes place, the grinding continues until the electroplated third copper layer 46 is exposed for electrical connection. In some instances, the back-grinding will continue to a sufficient depth that the final passivation layer 70 is exposed and the copper via has each of layers 46, 44, and 40 exposed as cylindrical tubes. In other embodiments, the back-grinding will stop just after the copper is exposed, removing the first copper layer 40 and the second copper layer 44 since they are quite thin and even a small amount of grinding will begin to remove these layers. The bulk of electroplated third copper layer 46 is retained in this embodiment to provide solid connection for solder balls to be added thereafter.

Figure 3:
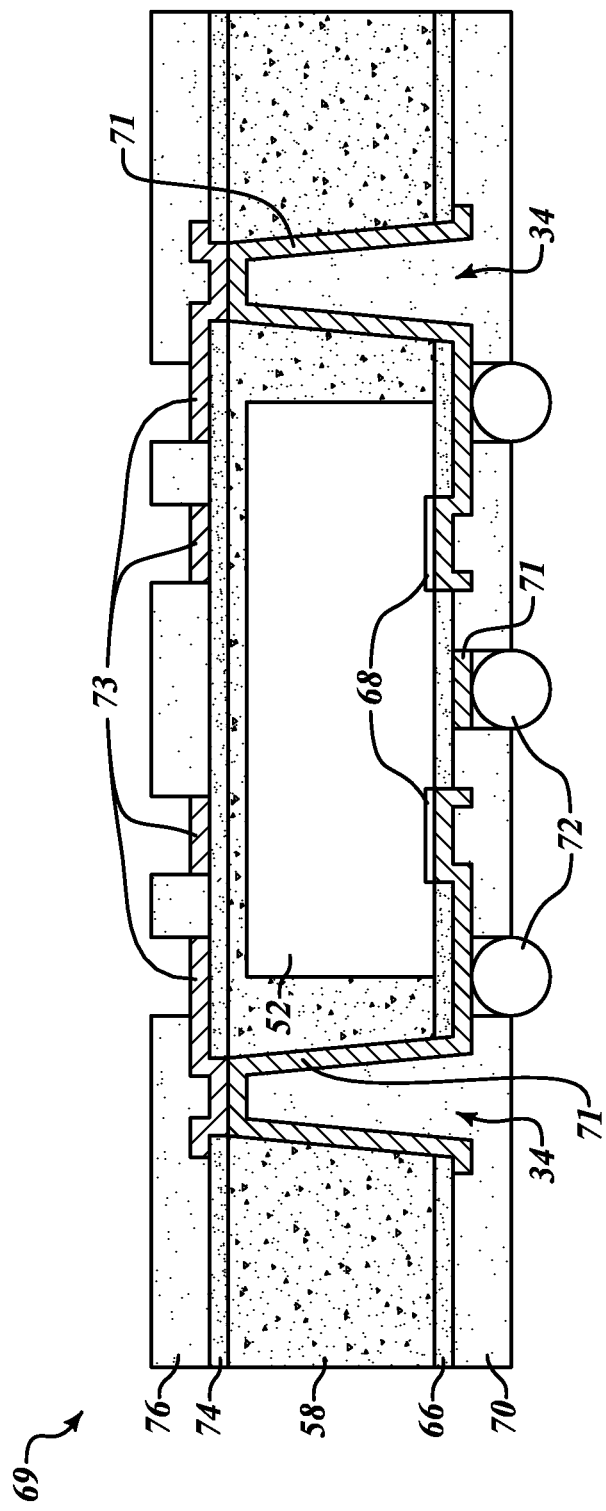
FIG. 3 is a cross-section of an embedded wafer level ball grid array according to one embodiment.

FIG. 3 illustrates an integrated circuit package 69 including an integrated circuit 52 embedded in a reconstituted wafer 58. The integrated circuit package 69 is formed by dicing a processed reconstituted wafer 58 into a plurality of individual integrated circuit packages 69. Each integrated circuit package 69 contains an integrated circuit 52 embedded in a diced portion of the reconstituted wafer 58.

In FIG. 3 two trenches 34 are on either side of the integrated circuit 52. The trenches 34 are lined with a copper layer 71. The copper layer 71 includes the first, second, and third copper layers 40, 44, 46 of the previous figures. However, the three copper layers 40, 44, and 46 are shown as a single copper layer 71 in FIG. 3 for simplicity. The trenches 34 are shown as smooth trenches in FIG. 3, but may include rough indentations and protrusions as shown in previous figures. After formation of the trenches or vias 34, the reconstituted wafer 58 has been flipped so that the die pads 68 of the integrated circuit 52 now face downward in FIG. 3. Solder balls 72 have been attached to the copper layer 71 through openings in the passivation layer 70. The integrated circuit package 69 shown as shown in FIG. 3 may be installed in an electrical device. For example, the integrated circuit package 69 may be installed on a printed circuit board in an electrical device. The printed circuit board may have a pattern of printed electrical pads on which the solder balls 71 of the integrated circuit may be placed.

On the top side of the integrated circuit package 69, as shown in FIG. 3, conducting traces 73 have been formed and patterned on a dielectric layer 74. The conducting traces 73 contact the copper layer 71 through patterned openings in the dielectric layer 74. The conducting traces 73 may be formed of one or more layers of copper as described previously. The conducting traces 73 may also be formed of other conducting materials. A passivation layer 76 has been deposited over the conducting traces 73 and etched at selected locations to allow electrical connection from the top side with conducting traces 73. In other embodiments it is possible to perform back-grinding and formation of conducting traces 73 before the trench 34 has been drilled. In such an embodiment the trench 34 is drilled after the conducting traces 73 have been formed. The conducting traces 73 then act as an etch stop for the laser drill. The trench 34 can then be coated with conducting layer 71 as described previously.

Additional electrical components may be stacked on top of the integrated circuit package 69 and electrically connected to the integrated circuit 52 through contact with conducting traces 73 which are in electrical connection with die pads 68. For example, passive circuit components like resistors, capacitors, or inductors may be placed in contact with the conducting traces 73. Additional integrated circuit packages may also be stacked on the integrated circuit package 69.

Figure 4:
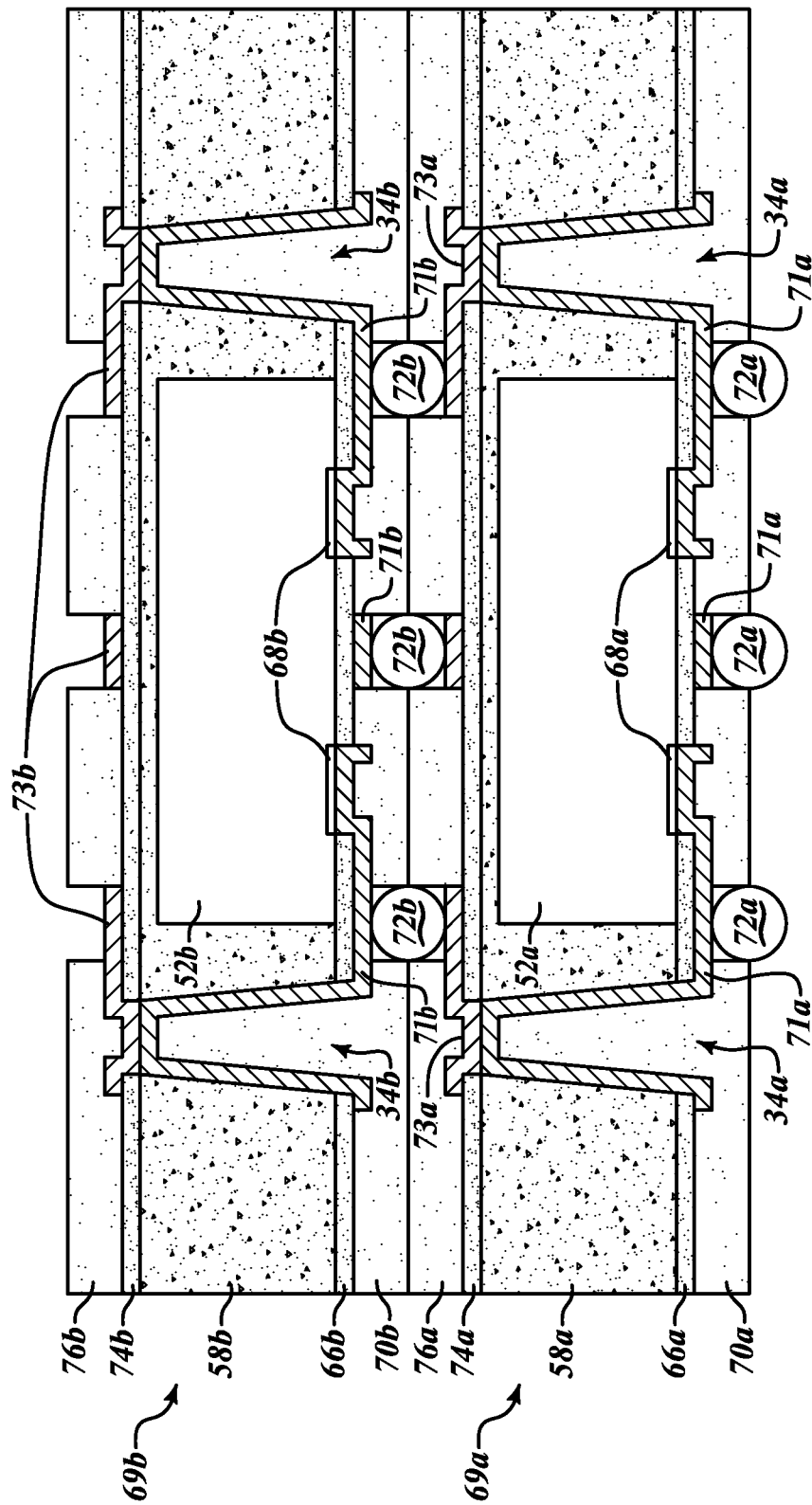
FIG. 4 is a cross-section of two stacked embedded wafer level ball grid arrays according to one embodiment.

FIG. 4 illustrates two integrated circuit packages 69a, 69b. Integrated circuit package 69b is stacked on top of integrated circuit package 69a. The integrated circuit packages 69a, 69b are substantially similar to the integrated circuit package 69 of FIG. 3. Each integrated circuit package 69a, 69b contains an integrated circuit 52a, 52b embedded in a portion of a reconstituted wafer 58a, 58b. Trenches 34a, 34b have been formed in the reconstituted wafers 58a, 58b as described previously. Copper layers 71a, 71b line trenches 34a, 34b and contact die pads 68a, 68b of integrated circuits 52a, 52b. While copper layers 71a, 71b are shown as single layers in FIG. 4, each layer 71a, 71b contains three copper layers 40, 44, 46 as described previously.

Integrated circuit package 69b is electrically connected to integrated circuit package 69a by means of solder balls 72b. Solder balls 72b are in contact with copper layer 71b and conducting traces 73a through openings in passivation layers 70b and 76a. Integrated circuit packages 69a, 69b may be installed in an electrical device, for example on a printed circuit board of the electrical device, by means of solder balls 72a which are in electrical connection with copper layer 71a through openings in the passivation layer 70a.

FIG. 4 illustrates two die pads 68a, 68b on each integrated circuit 52a, 52b. In practice there may be many more die pads on each integrated circuit 52a, 52b. While FIG. 4 shows die pads 68b in electrical connection with die pads 68a, in practice the die pads 68a, 68b may be electrically insulated from each other. There are numerous configurations of electrical connections between the integrated circuit packages 69a, 69b which will be apparent to those of skill in the art in view of the present disclosure.

FIG. 4 further illustrates that other components may be stacked on top of integrated circuit package 69b. For example, passive electrical components or other integrated circuit packages may be connected to conducting traces 73b on top of integrated circuit package 69b.

FIG. 5 illustrates a trench 34 in a substrate 32 according to one embodiment. In FIG. 5 a trench 34 having an uneven sidewall 38 has been opened in substrate 32. Copper layers 40, 44, 46 line the sidewall 38 of the trench 34. However, a diffusion barrier layer 80 has been formed between the sidewall of the trench 38 and the first copper layer 40. The diffusion barrier layer 80 is a conducting material, for example a TiW layer between 10 nm and 300 nm thick. The diffusion barrier layer 80 is formed by a physical vapor deposition process, for example by sputtering. The diffusion barrier layer 80 may be of any suitable material that inhibits copper atoms from the copper layers 40, 44, 46 from diffusing into the substrate 32, for example Ti, TiN, or other suitable barrier materials.

The diffusion barrier layer 80 is shown as coating the entire sidewall 38 of the trench 34. However, in practice it is possible that the diffusion barrier layer 80 may not cover indented portions of the sidewall 38 of the trench 34. While the diffusion barrier layer 80 has been shown and described only in relation to the embodiment of FIG. 5, the diffusion barrier layer 80 may be present in any of the embodiments of FIGS. 1A-4.

The layers 40, 44, 46 have been described as copper layers in relation to the Figures. However, other conducting materials may be used for the layers 40, 44, 46. Furthermore, the materials and layers described above have been given only by way of example. In practice more structures may be present and other suitable materials may be used as will be apparent to those of skill in the art in light of the present disclosure. The relative sizes of various layers and structures have not been drawn to scale.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming an aperture in a substrate;
    attaching an integrated circuit die to the substrate;
    depositing a first layer of conductive material in the aperture and on a contact pad of the integrated circuit die by physical vapor deposition;
    depositing a second layer of conductive material in the aperture and on the contact pad by electroless plating; and
    depositing a third layer of conductive material in the aperture and on the contact pad by electroplating.

2. The method of claim 1, further comprising depositing a barrier layer in the aperture prior to depositing the first layer of conductive material.

3. The method of claim 2 wherein the barrier layer is formed of a material selected from a group consisting of TiW, Ti, Cr, TiN, and TaN.

4. The method of claim 1, further comprising filling the aperture with a dielectric material.

5. The method of claim 1 wherein the first layer of conductive material is copper.

6. The method of claim 1 wherein the second and third layers of conductive material are copper.

7. A method comprising:
    attaching a first integrated circuit die to a substrate;
    forming an aperture in a substrate;
    forming a first layer of copper in the aperture and on a contact pad of the integrated circuit die;
    forming a second layer of copper in the aperture and on the contact pad;
    forming a third layer of copper in the aperture and on the contact pad;

placing a first solder ball on over a first surface of the substrate; and electrically connecting the solder ball to the first layer of copper.

8. The method of claim 7 comprising:

placing a second integrated circuit over a second surface of the substrate; and electrically connecting a contact pad of the second integrated circuit to the first layer of copper.

9. The method of claim 7 wherein a second solder ball is between the second integrated circuit and the second surface of the substrate, the second solder ball being electrically connected to the contact pad of the second integrated circuit.

* * * * *